(12) United States Patent
Singh et al.

(10) Patent No.: US 12,140,637 B2
(45) Date of Patent: Nov. 12, 2024

(54) MOTOR WINDING FAULT DIAGNOSIS

(71) Applicant: EATON INTELLIGENT POWER LIMITED, Dublin (IE)

(72) Inventors: Gurmeet Singh, Maharashtra (IN); Deepak Balaji Somayajula, Maharashtra (IN); Satish Mohanty, Pune (IN); Chaitanya Pradeep Bhalwankar, Pune (IN); Stuart John Moody, Portchester (GB); Daniel Peck, Southampton (GB); Nirav Mahenra Parmar, Pune (IN)

(73) Assignee: Eaton Intelligent Power Limited, Dublin (IE)

( * ) Notice: Subject to any disclaimer, the term of this patent is extended or adjusted under 35 U.S.C. 154(b) by 154 days.

(21) Appl. No.: 18/081,190

(22) Filed: Dec. 14, 2022

(65) Prior Publication Data
US 2023/0194612 A1    Jun. 22, 2023

(30) Foreign Application Priority Data

Dec. 17, 2021   (IN) .............. 202111059029

(51) Int. Cl.
*G01R 31/34*   (2020.01)
*G01R 25/00*   (2006.01)
*H02P 29/024*  (2016.01)

(52) U.S. Cl.
CPC ........ *G01R 31/346* (2013.01); *G01R 25/00* (2013.01); *H02P 29/024* (2013.01)

(58) Field of Classification Search
CPC ...... G01R 31/346; G01R 25/00; G01R 31/52; G01R 31/343; H02P 29/024; H02P 6/00
See application file for complete search history.

(56) References Cited

U.S. PATENT DOCUMENTS

| | | | |
|---|---|---|---|
| 2005/0218907 A1* | 10/2005 | Lee .................... | H01H 31/12 324/510 |
| 2009/0033357 A1* | 2/2009 | Lindsey .............. | G01R 31/346 361/21 |
| 2014/0117912 A1 | 5/2014 | Gajic et al. | |
| 2018/0095134 A1* | 4/2018 | Nadarajan ........... | G01R 31/343 |
| 2021/0148990 A1* | 5/2021 | Bohlländer ........... | G01R 31/52 |

OTHER PUBLICATIONS

European Patent Office; Extended European Search Report for application No. EP 22214167.3 mailed May 3, 2023; 11 pages.

(Continued)

*Primary Examiner* — Jermele M Hollington
*Assistant Examiner* — Zannatul Ferdous
(74) *Attorney, Agent, or Firm* — Merchant & Gould P.C.

(57) ABSTRACT

The present disclosure relates to systems and methods for detecting a winding fault and the winding fault severity in a brushless direct current motor before motor failure. Methods for detecting a winding fault include time domain based sequence component analysis, fast Fourier transform analysis, or Hilbert analysis. Methods for detecting the severity of a winding fault include analysis of the standard deviation of real mean squared values determined using motor currents.

20 Claims, 11 Drawing Sheets

(56) References Cited

OTHER PUBLICATIONS

Monia Ben Khader Bouzid et al.; "New Expressions of Symmetrical Components of the Induction Motor Under Stator Faults", IEEE Transactions on Industrial Electronics, IEEE Service Center, Piscataway, NJ, USA, vol. 60, No. 9, Sep. 2013 (Sep. 2013), pp. 4093-4102.
Abhisek Ukil et al: "Detection of stator short circuit faults in three-phase induction motors using motor current zero crossing instants", Electric Power Systems Research, Elsevier, Amsterdam, NL, vol. 81, No. 4, Dec. 14, 2010 (Dec. 14, 2010), pp. 1036-1044.
Faiz Jawad et al: "Eccentricity fault diagnosis indices for permanent magnet machines: state-of-the-art", IET Electric Power Applications, IET, UK, vol. 13, No. 9, Sep. 2019 (Sep. 2019), pp. 1241-1254.

* cited by examiner

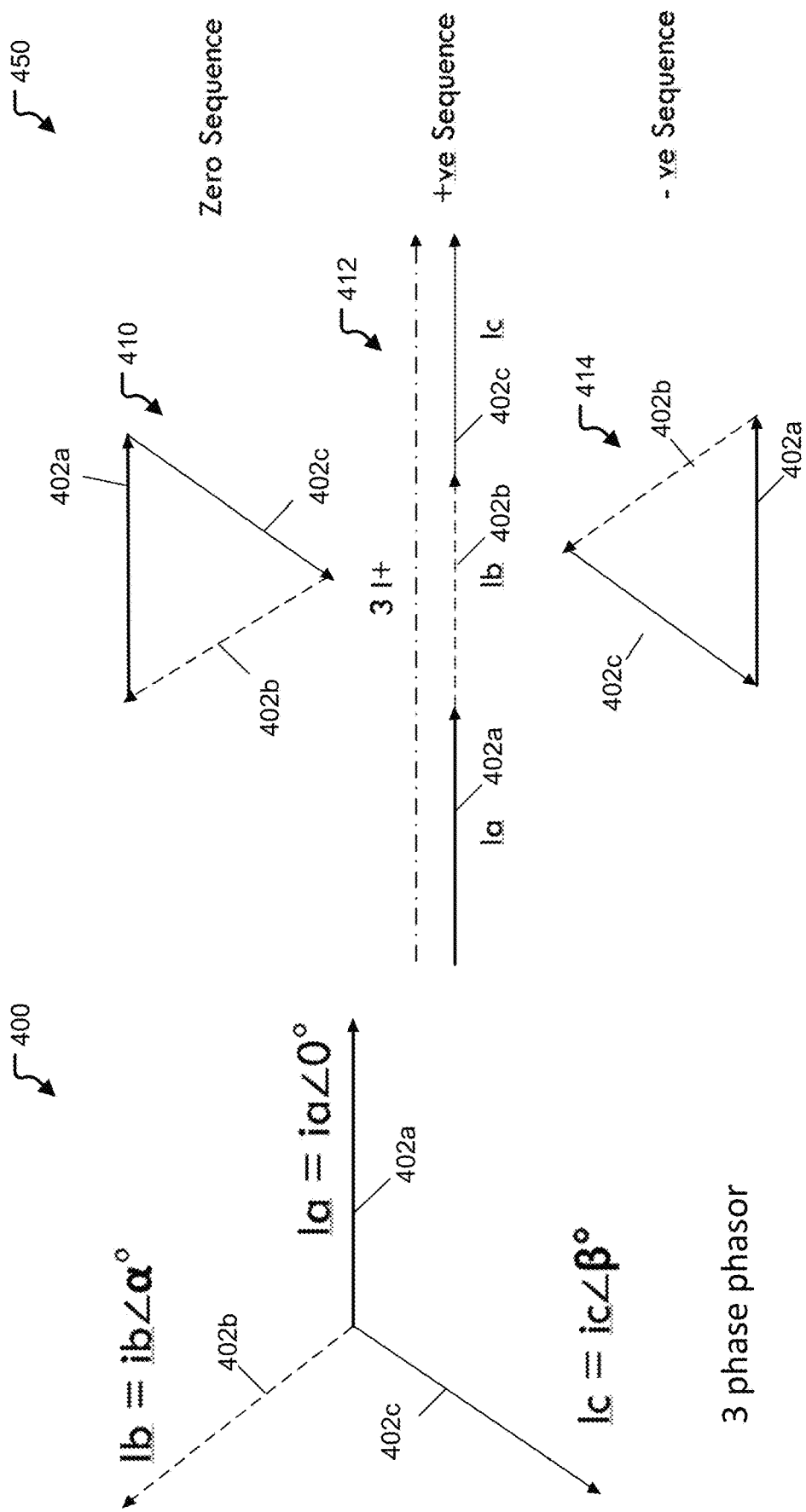

$$I_{abc} = \begin{bmatrix} I_a \\ I_b \\ I_c \end{bmatrix} = \begin{bmatrix} I_0 + I_1 + I_2 \\ I_0 + a^2 * I_1 + a * I_2 \\ I_0 + a * I_1 + a^2 * I_2 \end{bmatrix} = A * I_{012}$$

$$\begin{bmatrix} I_0 \\ I_1 \\ I_2 \end{bmatrix} = \frac{1}{3} \begin{bmatrix} 1 & 1 & 1 \\ 1 & a & a^2 \\ 1 & a^2 & a \end{bmatrix} * \begin{bmatrix} I_a \\ I_b \\ I_c \end{bmatrix}$$

Where, $A = \begin{bmatrix} 1 & 1 & 1 \\ 1 & a^2 & a \\ 1 & a & a^2 \end{bmatrix}$   $I_{012} = \begin{bmatrix} I_0 \\ I_1 \\ I_2 \end{bmatrix}$ $a = e^{\frac{2\pi i}{3}}$   $a^2 = e^{\frac{4\pi i}{3}}$

*Fig. 5*

MOTOR WINDING FAULT DIAGNOSIS

CROSS-REFERENCE TO RELATED APPLICATION

This application claims the benefit of Indian Provisional Patent Application No. 202111059029, filed on Dec. 17, 2021, the disclosure of which is incorporated herein by reference in its entirety.

FIELD

The present disclosure generally relates to methods and systems for motor winding fault diagnosis.

BACKGROUND

Electric motors, such as brushless direct current electric (BLDC) motors, are machines that convert electrical energy into mechanical energy and are used in many systems. Example systems that use electric motors include, but are not limited to, aircraft systems and components of the aircraft such as a fuel transfer system, electric vehicles, cordless power tools, heating, ventilation, air conditioning systems, refrigeration systems, industrial systems that include servo, actuation, positioning, and variable speed applications, and the like. In these systems, the electric motors may continuously operate under stresses including environmental, thermal, electrical, and mechanical stresses. The stresses lead to motor degradation that can potentially lead to motor failure.

The cause of the motor failure may be bearing, winding, and/or rotor demagnetization faults. A winding fault can be catastrophic as the fault can lead to electrical short circuits or fire due to high temperatures produced. Therefore, detecting motor degradation and failure before winding faults occur is necessary to prevent system loss.

SUMMARY

One aspect of the present disclosure relates to a method for detecting a winding fault in a motor. The method includes the steps of: receiving a current signal at each armature of the motor, wherein each armature is operable to receive a phase of power received by the motor; processing each current signal to determine a current phasor of each current signal; determining a negative sequence component using the current phasors; determining a zero sequence component using the current phasors; comparing the negative sequence component to a baseline negative sequence component and the zero sequence component to a baseline zero sequence component; and in response to determining that one or both of the negative sequence component is greater than the baseline negative sequence component and the zero sequence component is greater than the baseline zero sequence component, determining that the motor has the winding fault.

Another aspect of the present disclosure relates to a system for detecting a winding fault in a motor. The system includes a memory; and a processing device operable to execute instructions stored in the memory, wherein the executed instructions are operable to cause the processing device to: receive a current signal at each armature of the motor, wherein each armature is operable to receive a phase of power received by the motor; process each current signal to determine a current phasor of each current signal; determine a negative sequence component using the current phasors; determine a zero sequence component using the current phasors; compare the negative sequence component to a baseline negative sequence component and the zero sequence component to a baseline zero sequence component; and in response to determining that one or both of the negative sequence component is greater than the baseline negative sequence component and the zero sequence component is greater than the baseline zero sequence component, determining that the motor has the winding fault.

Another aspect of the present disclosure relates to a method for determining a severity of a winding fault in a motor. The method includes the steps of: determining a real mean squared (RMS) value using a current signal of each armature of the motor, wherein each armature is operable to receive a phase of power received by the motor; determining a standard deviation of the RMS value; determining whether the standard deviation divided by a baseline standard deviation is greater than one; in response to determining the standard deviation divided by the baseline standard deviation is greater than one determining whether the standard deviation divided by the baseline standard deviation is greater than a threshold value; in response to determining that the standard deviation divided by the baseline standard deviation is greater than the threshold value, determining that the severity is low; and in response to determining that the standard deviation divided by the baseline standard deviation is greater than the threshold value, determining that the severity is high. In one example, the method further includes determining the motor does not have the winding fault in response to determining the standard deviation divided by the baseline standard deviation is not greater than one.

BRIEF DESCRIPTION OF THE DRAWINGS

FIG. 4A illustrates example current phasors of the motor shown in FIG. 1A in accordance with the principles of the present disclosure;

FIG. 4B illustrates example sequence components of the motor shown in FIG. 1A in accordance with the principles of the present disclosure;

FIG. 5 is an equation for determining sequence components of the currents of the motor shown in FIG. 1A in accordance with the principles of the present disclosure;

DETAILED DESCRIPTION

Figure 1A:
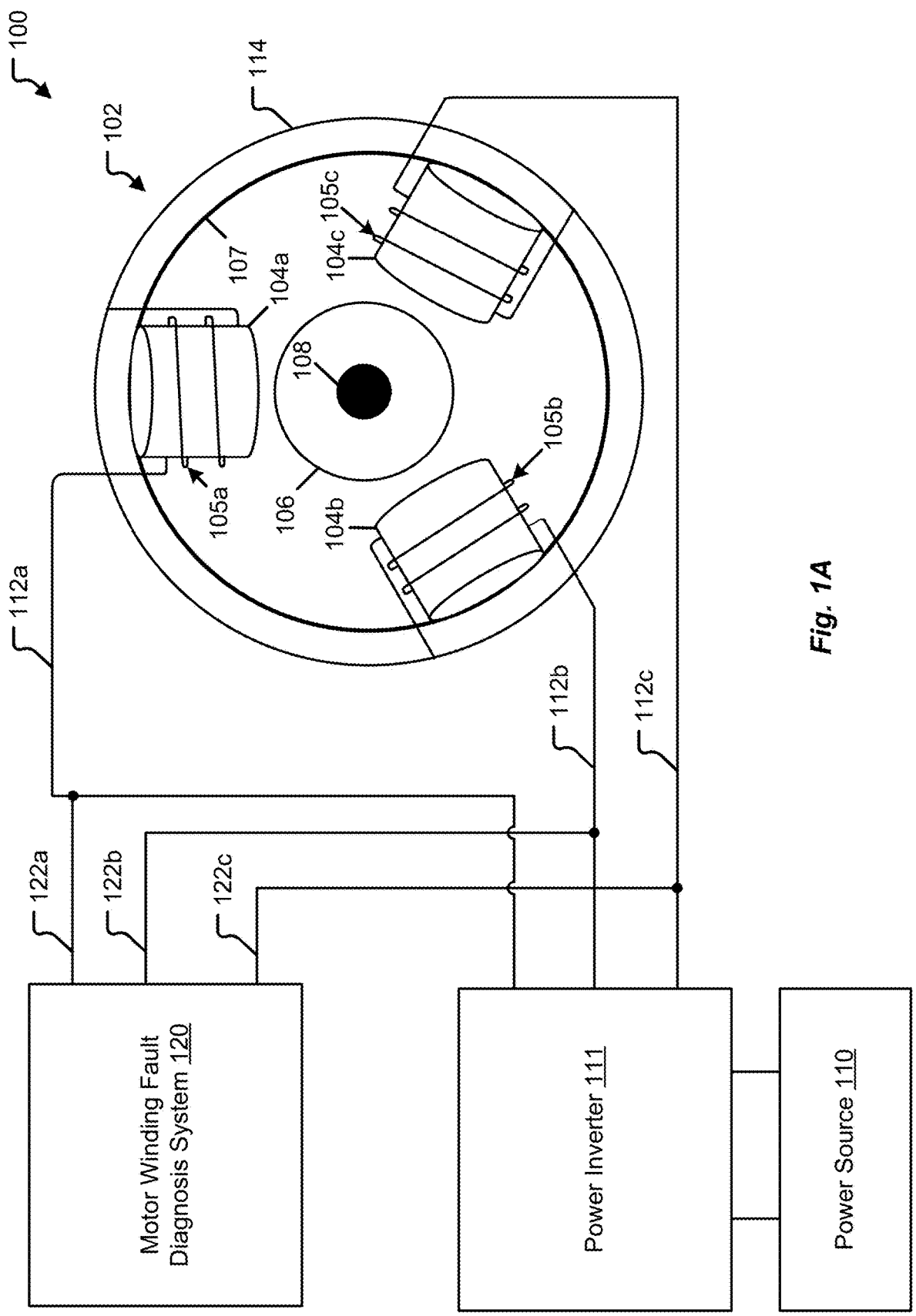
FIG. 1A is a schematic of a motor winding fault diagnosis environment in accordance with the principles of the present disclosure.

Reference will now be made in detail to examples of the present disclosure which are illustrated in the accompanying drawings. Throughout the following detailed description, the same reference numerals refer to the same elements in all figures. Reference will be made primarily to brushless direct current (BLDC) motors herein. However, the following methods, systems, and examples may be used or otherwise applied to other types of electric motors that may experience a winding fault, including other types of direct current (DC) motors and alternating current (AC) motors.

Examples disclosed herein describe systems and methods for detecting a winding fault in a BLDC motor. The systems and methods described detect the winding fault before the BLDC motor fails. The systems and methods may use an algorithm that includes a time-based sequence component analysis, fast Fourier transform (FFT) analysis, and/or Hilbert analysis to detect a winding fault. The methods and systems may also detect the severity of a detected winding fault. The systems and methods may use an algorithm that includes evaluating the standard deviation of real mean squared (RMS) values of line currents of a motor being evaluated to detect the severity of the winding fault.

FIG. 1A is a schematic of a motor winding fault diagnosis environment 100 in accordance with the principles of the present disclosure. The motor winding fault diagnosis environment 100 includes a BLDC motor 102, a power source 110, a power inverter 111, and a motor winding fault diagnosis system 120.

The power source 110 supplies power to the BLDC motor 102. In this example, the BLDC motor 102 is a three-phase motor, so the power source 110 supplies power to the power inverter 111, and the power inverter 111 supplies power to the BLDC motor 102 in three phases via conductors 112a, 112b, and 112c. The power inverter 111 may receive direct current (DC) power from the power source 110 and invert or otherwise process the DC power to produce alternating current (AC) power. Therefore, the BLDC motor 102 receives AC power from the power inverter 111. In an example, the power inverter 111 is a DC-AC variable-frequency drive inverter, but the power inverter 111 may be any type of inverter that can convert DC power to AC power and/or convert AC power to DC power. Methods and/or operations the power source 110 and/or the power inverter 111 use to supply power to the BLDC motor 102 will be explained in more detail herein with respect to FIG. 2. The conductors 112a, 112b, 112c may be any component that conducts electricity, such as electrical wiring. In other examples, the BLDC motor 102 may be any other number phase motor, and the power source 110 and power inverter 111 may supply power via more, the same, or less conductors.

The BLDC motor 102 includes three armatures 104a, 104b, 104c, a rotor 106, a stator 107, and a bearing 108. The stator 107 is the stationary portion of the BLDC motor 102. In this example, the armatures 104a, 104b, 104c may be positioned on the stator 107. It is common to refer to armatures as stators, but the armatures 104a, 104b, 104c and the stator 107 will be referred to herein as separate components of the BLDC motor 102 for clarity. The armatures 104a, 104b, 104c may receive energy supplied by the power source 110 and/or the power inverter 111 and may generate a magnetic field. The armature 104a includes windings 105a, armature 104b includes windings 105b, and armature 104c includes windings 105c. The windings 105a, 105b, 105c may be any electrical conductor, and the windings 105a, 105b, 105c are the components of the armatures 104a, 104b, 104c that receive the power supplied by the power source 110 and/or the power inverter 111. The windings 105a, 105b, 105c are respectively wrapped around the armatures 104a, 104b, 104c. When power is supplied via the windings 105a, 105b, 105c, the armatures 104a, 104b, 104c induce or otherwise generate a magnetic field. In the illustrated example, the windings 105a, 105b, 105c are wrapped around the respective armature 104a, 104b, 104c twice. However, the windings 105a, 105b, 105c may be wrapped around the armatures 104a, 104b, 104c any number of times. The windings 105a, 105b, 105c can be connected to a common electrical ground 114.

In some examples, the illustrated configuration of the rotor 106 and the armatures 104a, 104b, 104c is reversed. The armatures 104a, 104b, 104c may be attached to the bearing 108 and the magnets in the rotor 106 can be positioned on the stator 107. The armatures 104a, 104b, 104c would spin when the BLDC motor 102 is supplied with power in this example.

The rotor 106 can be attached to the bearing 108. The bearing 108 allows the rotor 106 to spin and therefore generate mechanical energy. The rotor may include one or more magnets that can be attracted to the magnetic field induced by one or more of the armatures 104a, 104b, 104c when power is supplied to the windings 105a, 105b, and/or 105c.

The windings 105a, 105b, 105c may degrade and/or fail for many reasons, including (1) electrical failures such as a blown fuse, an open contact, a bad connection, and the like; (2) insulation failures caused by contaminants, abrasion, vibration, voltage surges, and the like; (3) thermal deterioration of insulation caused by unbalanced loads on the power source 110, poor connections, high resistance contact, and the like; and (4) bearing failures caused by looseness, imbalance, or misalignment of the bearing 108. If the motor windings fail, the system may be damaged or destroyed, and the failure may cause hazardous conditions such as fires. Therefore, the motor winding fault diagnosis system 120 monitors the BLDC motor 102 to detect winding failures, such as the failure of the windings 105a, 105b, 105c.

The motor winding fault diagnosis system 120 detects the current of the power supplied to the BLDC motor by the power source 110 and/or the power inverter 111. In this example, the motor winding fault diagnosis system 120 detects the current using current sensors 122a, 122b, and 122c. The current sensor 122a detects the current of the power supplied via conductor 112a by connecting to the conductor 112a. Similarly, the current sensors 122b and 122c connect to conductors 112b and 112c respectively to measure the current of conductors 112b and 112c. In some examples, the current sensors 122a, 122b, 122c do not require a direct or physical connection to the conductors 112a, 112b, 112c. Techniques that the motor winding fault diagnosis system 120 can use to detect the current of the power supplied by the conductors 112a, 112b, 112c include sensors based on the law of induction, magnetic field sensors, faraday effect sensors, hall effect sensors, transformer or current clamp meters, fluxgate sensors, shunt resistors, fiber optic current sensors, or the like. Thus, in some examples, the motor winding fault diagnosis system 120 may include more or less current sensors 122a, 122b, 122c.

In some examples, the motor winding fault diagnosis system 120 receives power from the power source 110 to operate. In other examples, the motor winding fault diagnosis system 120 includes a power supply or receives power from another external source. In further examples, the power source 110 can supply power to the BLDC motor 102 indirectly, such as via a direct connection to the motor winding fault diagnosis system 120 and the motor winding fault diagnosis system 120 subsequently supplies the power to the BLDC motor 102 via a connection between the motor winding fault diagnosis system 120 and the BLDC motor 102. The motor winding fault diagnosis system 120 may supply the power to the power inverter 111, and the power inverter 111 will supply the power to the BLDC motor 102.

Figure 1B:
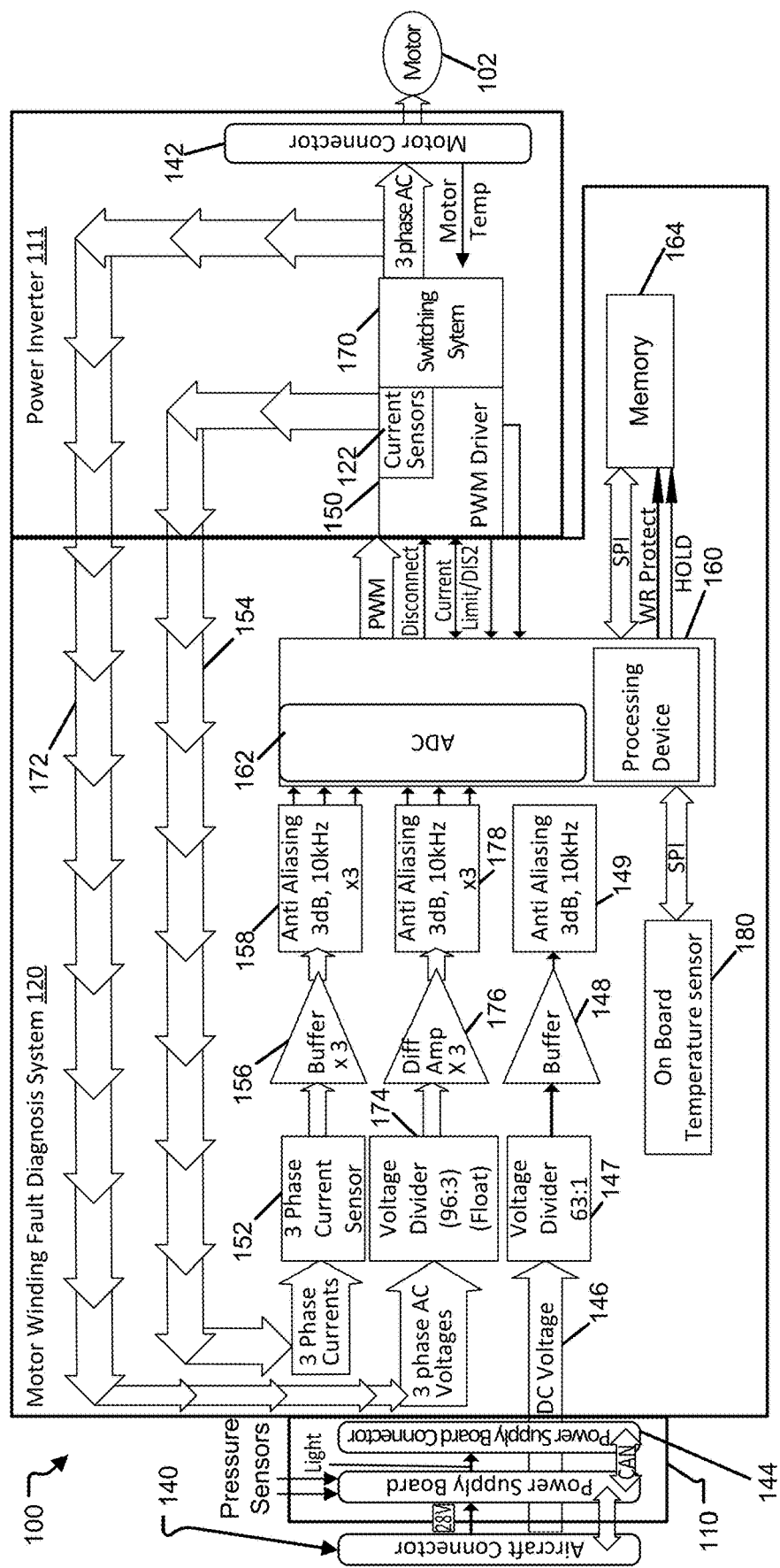
FIG. 1B is a schematic of a motor winding fault diagnosis system in the environment shown in FIG. 1A in accordance with the principles of the present disclosure.

FIG. 1B is a schematic of a motor winding fault diagnosis system 120 in the environment 100 shown in FIG. 1A in accordance with the principles of the present disclosure. In this example, the environment 100 is located on an aircraft, and the power source 110 is connected to the aircraft via aircraft connector 140. Thus, the BLDC motor 102 is a component of the aircraft. In certain examples, the motor winding fault diagnosis system 120 may monitor more than one motor simultaneously, such as if the aircraft includes multiple motors. In this example. the power inverter 111 may be part of the motor winding fault diagnosis system 120. The motor winding fault diagnosis system 120 can be operably connected to the BLDC motor 102 via a motor connector 142. In this example, the power source 110 indirectly supplies power to the BLDC motor 102 as described above by suppling power 146 to the motor winding fault diagnosis system 120 via the power supply connection 144. The power 146 flows through the motor winding fault diagnosis system 120 and then to the power inverter 111. The power 146 is then supplied to the BLDC motor 102 by the power inverter 111 via the motor connection 142.

The BLDC motor 102 may receive power via the motor connector 142. Because the power source 110 is indirectly connected to the BLDC motor 102 in this example, the motor winding fault diagnosis system 120 does not connect to the conductors 112a, 112b, 112c shown in FIG. 1A via the current sensors 122a, 122b, 122c. Instead, the current sensors 122a, 122b, 122c are part of the power inverter 111 shown as current sensors 123, are part of the three-phase current sensor 152, and/or are conductors that allow the three-phase current signals 154 to be received by the three-phase current sensor 152 from the current sensors 123.

The power 146 supplied via the power supply connection 144 is received by a voltage divider 147. The voltage divider 147 may reduce the voltage of the power 146 and output the divided power to a buffer circuit 156. The operation of the buffer circuit 156 will be described in detail herein. The buffer circuit 156 may output buffered power to an anti-aliasing filter circuit 158. The operation of the anti-aliasing filter circuit 158 will be described in detail herein.

In this example, a pulse width modulator (PWM) driver circuit 150 in the power inverter 111 can be operably connected to current sensors 122a, 122b, 122c and a three-phase current sensor 152. The PWM driver circuit 150 provides three-phase current signals to the current sensors 123. The current sensors 123 output the three-phase current signals 154, which are received by the three-phase current sensor 152. The current sensors 122a, 122b, 122c shown in FIG. 1A may be one or more of the current sensors 123, the three-phase current sensor 152, and/or the conductors that output the three-phase current signals 154 to the three-phase current sensor 152.

The three-phase current sensor 152 is operably connected to a buffer circuit 156. The buffer circuit 156 prevents components of the motor winding fault diagnosis system 120 from being overloaded by the three-phase current signals 154. The components of the motor winding fault diagnosis system 120 that the buffer circuit 156 protects includes the anti-aliasing filter circuit 158, an analog-to-digital converter (ADC) 162, and a processing device 160, all of which will be described below. The buffer circuit 156 outputs buffered current signals produced using the three-phase current signals 154. The buffer circuit 156 outputs the buffered current signals that are input into the anti-aliasing filter circuit 158. The anti-aliasing filter circuit 158 outputs filtered current signals produced using the buffered current signals. In the illustrated example, the buffer circuit 156 represents three buffer circuits (one for each phase) and the anti-aliasing filter circuit 158 represents three anti-aliasing filter circuits (one for each phase). The operation(s) of the anti-aliasing filter circuit 158 will be discussed in more detail herein with respect to FIG. 3.

The analog-to-digital converter ADC circuit 162 samples the filtered current signals output by the anti-aliasing filter circuit 158 to produce sampled current signals and provides the sampled current signals to the processing device 160. For example, the ADC circuit 162 samples the filtered current signals by converting the filtered current signals, which are analog signals, into digital signals for the processing device 160 to use. The sampled current signals represent the current levels of the three-phase current signals 154 sensed by the three-phase current sensor 152.

In some examples, the three-phase current sensor 152 includes more or less components that buffer, filter, and/or perform some other operation on the three-phase current signals 154 than shown in FIG. 1A. For example, the three-phase current signals 154 may not need to be buffered by the buffer circuit 156 and/or may not need to be filtered by the anti-aliasing filter circuit 158.

The processing device 160 can use the sampled signals to detect a winding fault of the BLDC motor 102 and/or the severity of the winding fault of the BLDC motor 102. A memory 164 can be operably connected to the processing device 160. The memory 164 can store computer-executable instructions that when executed by the processing device 160 cause operations disclosed herein to be performed. The memory 164 can also store the results the processing device 160 produces when evaluating one or more motors for winding faults. The processing device 160 may analyze the stored results to determine whether one or more motors is degrading over time. For example, the memory 164 may store the results of produced by the processing device 160 from evaluating the BLDC motor 102 multiple times. The produced results may change over time, and the changes may indicate to the processing device 160 that the BLDC motor is 102 is degrading in some way, including due to a winding fault. If the processing device 160 monitors the one or more motors that it evaluates for winding faults using the previous results stored by the memory 164, the processing device 160 can identify degradation patterns of the one or more motors that allow the processing device 160 to identify an early stage indication of failure.

The processing device 160 can be any suitable processing device, such as a processor, a CPU, a digital signal processor, a field programmable gate array, or combinations thereof. The memory 164 may be any suitable read-only memory and/or random-access memory. Methods for detecting a winding fault and/or the severity of a winding fault, for example, by the processing device 160 executing instructions stored by the memory 164 to perform operations will be discussed in further detail herein with respect to FIGS. 5, 6A, 6B, and 7.

In some examples, the motor winding fault diagnosis system 120 may include additional components operable to control the operation of BLDC motor 102 and/or additional motors. For example, the motor winding fault diagnosis system 120 may be able to alter the operation of the BLDC motor 102 if a winding fault is detected and based on the determined severity of the winding fault.

The components of the motor winding fault diagnosis system 120 may use to be able to alter the operation of the BLDC motor 102 if a winding fault is detected and based on the determined severity of the winding fault may include the above-described components, a switching system 170, a three-phase voltage sensor 174, a differential amplifier 176, an anti-aliasing filter circuit 178, and/or a temperature sensor 180. The switching system 170 may be a component of the power inverter 111 and may include one or more switching devices that control the output three-phase voltage signals 172 to the three-phase voltage sensor 174 and/or power to the BLDC motor 102. The three-phase voltage sensor 174 may reduce the voltage of the three-phase voltage signals 172 and output the reduced voltage signals to the differential amplifier 176. The differential amplifier 176 may amplify the voltage differences of the voltages of the phases and output the amplified voltages to the anti-aliasing filter circuit 178. The anti-aliasing filter circuit 178 may process the amplified voltages and output the amplified voltages to the ADC circuit 162 and/or the processing device 160.

The temperature sensor 180 senses the operating temperature(s) of the one or more components of the motor winding fault diagnosis system 120. The operating temperatures may be affected by the environment, by the operation of the motor winding fault diagnosis system 120, and/or the like. The processing device 160 may use the operating temperatures(s) to determine whether the motor winding fault diagnosis system 120 is limited to basic functionality. For example, the processing device 160 and the memory 164 may have an operating temperature(s) at or near their respective maximum operating temperatures. The processing device 160 may determine that that the operations of the motor winding fault diagnosis system 120 should be limited to basic operations to prevent the processing device 160 and/or the memory 164 from being damaged or failing.

The temperature sensor 180 and the processing device 160 may be used by the motor winding fault diagnosis system 120 to alter the operation of the BLDC motor 102 if a winding fault is detected and based on the determined severity of the winding fault. For example, the motor winding fault diagnosis system 120 may cease the operation of the BLDC motor 102 if there is a winding fault with high severity. A high severity winding fault may indicate imminent failure of the BLDC motor 102, a likelihood that hazardous conditions may occur, or some other dangerous and/or costly event.

In another example, the motor winding fault diagnosis system 120 may alter the operation of the BLDC motor 102 without ceasing its operation. A low severity winding fault may indicate an issue with the BLDC motor 102 that will require maintenance, an issue that affects the performance of the BLDC motor 102, and/or some event that does not indicate immediate attention is required. The motor winding fault diagnosis system 120 may include a communication system to notify a technician of the presence of a winding fault and/or the severity of the winding fault for the technician to perform maintenance on the BLDC motor 102 as required.

In certain examples, the motor winding fault diagnosis system 120 determines whether the motor winding fault diagnosis system 120 is limited to basic functionality or whether the motor winding fault diagnosis system 120 can perform more complex operations. For example, the processing device 160 may use the temperature sensed by the temperature sensor 180 and/or evaluate the components of the motor winding fault diagnosis system 120 to determine whether the motor winding fault diagnosis system 120 is limited to basic functionality or not.

Figure 2:
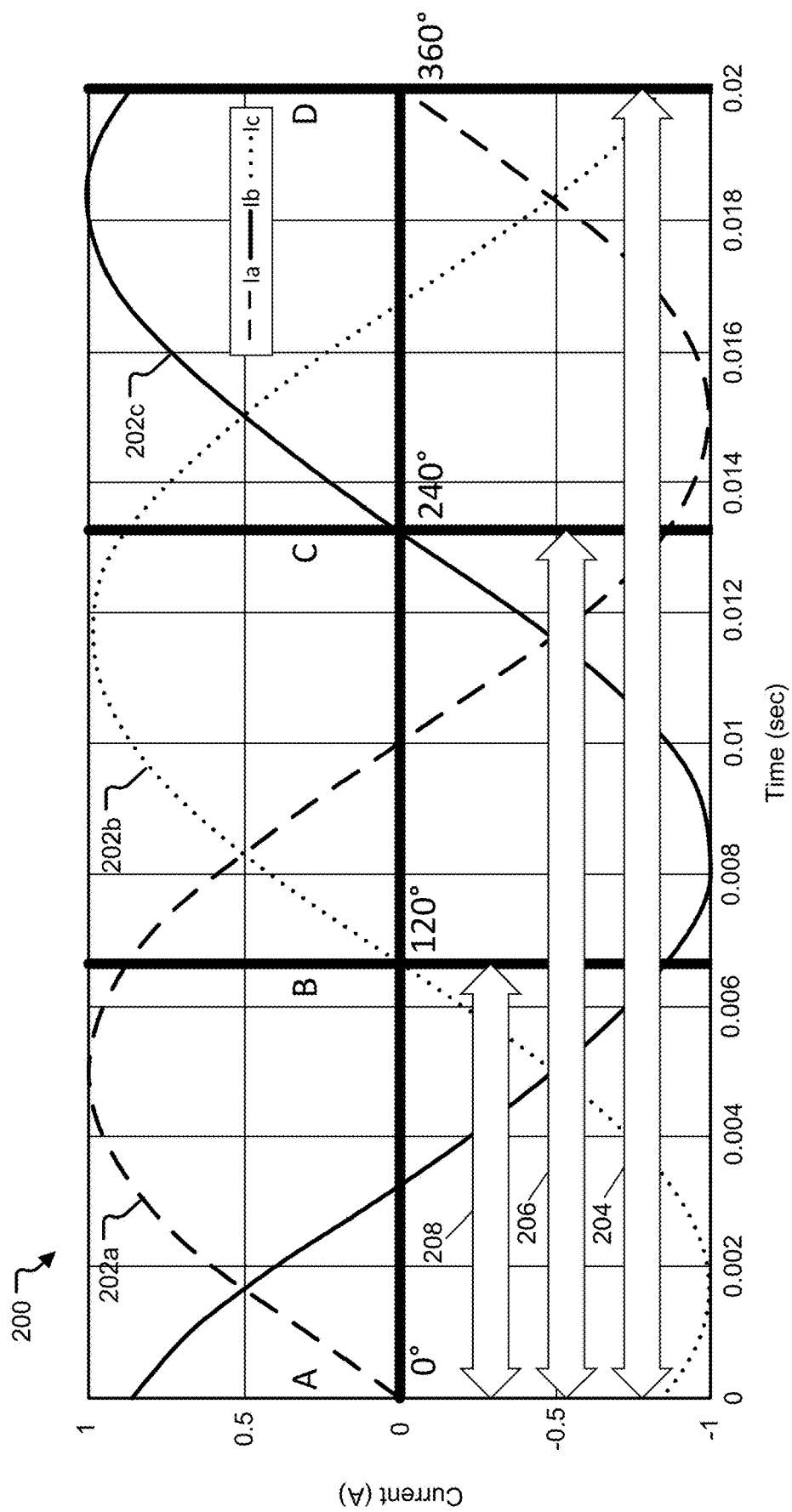
FIG. 2 illustrates example waveforms of currents of the motor shown in FIG. 1A in accordance with the principles of the present disclosure.

FIG. 2 illustrates example waveforms 200 of currents of the motor 102 shown in FIG. 1A in accordance with the principles of the present disclosure. The example waveforms 200 include current waveforms 202a, 202b, and 202c. In this example, the current waveforms 202a, 202b, and 202c are currents from a three-phase motor, such as the BLDC motor 102. For example, the current waveform 202a is the current of one phase, such as the current of the power supplied to armature 104a via conductor 112a as shown in FIG. 1A or via the motor winding fault diagnosis system 120 as shown in FIG. 1B. Similarly, the current waveform 202b is the current of the power supplied to the armature 104b, and the current waveform 202c is the current of the power supplied to the armature 104c.

In certain examples, the motor winding fault diagnosis system 120 may use a zero cross detection method using the current waveforms 202a, 202b, and 202c to estimate the motor supply frequency and the phase shifts of the currents. The motor winding fault diagnosis system 120 can then represent the currents as current phasors.

The motor winding fault diagnosis system 120 may first estimate the current supply frequency and the angular frequency of the currents. For example, the processing device 160 determines the current sampling rate Fs of motor winding fault diagnosis system 120 and for time t seconds. One complete cycle 204 consists of L number data points. In certain examples, the motor winding fault diagnosis system 120 evaluates the BLDC motor 102 for a winding fault using only a few cycles. The frequencies may be determined by the processing device 160 using the following equations:

Sampling time i.e., time between two successive samples=$1/Fs$

1 Cycle=$L$ Data points

Time period ($T$) for completing 1 Cycle or $L$ Data points=$(L-1)*(1/Fs)$

Supply frequency=$1/T$ Hz=$Fs/(L-1)$ Hz

Angular supply frequency ($w$)=$2*\pi*Fs/(L-1)$ rad/s

Once the supply frequency and the angular frequency are both determined, the processing device 160 may determine the phase differences of the current waveforms 202b and 202c with respect to current waveform 202a. To determine the phase differences, the processing device 160 may determine the partial cycles 206 and 208. The partial cycle 206 may be the cycle from the point the current waveform 202a has a current value of zero to the point where the current waveform 202c first has a current value of zero. Partial cycle 206 may be represented as L2. The partial cycle 208 may be the cycle from the point the current waveform 202a has a current value of zero to the point where the current waveform 202b first has a current value of zero. Partial cycle 208 may be represented as L1. The processing device 160 may then determine the phase differences by applying the following equations:

$L$ data point=one cycle i.e. 360° phase shift 1 data point=$(360/L)°$ phase shift $L1$ data point have $\alpha$ phase difference with respect to phase $A$ (current waveform 202a)= $(360/L)*L1°$ $L2$ data point have $\beta$ phase difference with respect to phase $A$ (current waveform 202a)= $(360/L)*L2°$ Once the frequencies and the phase differences are determined, the processing device 160 may determine the current phasors of the current waveforms 202a, 202b, 202c by applying the following equations:

$I_a = \max(i_a) * e^{jwt+0°}$ $I_b = \max(i_b) * e^{jwt+\alpha°}$ $I_c = \max(i_c) * e^{jwt+\beta°}$ $I_a$ is the current phasor of the current waveform 202a. $I_b$ is the current phasor of the current waveform 202b. $I_c$ is the current phasor of current waveform 202c.

Figure 3A:
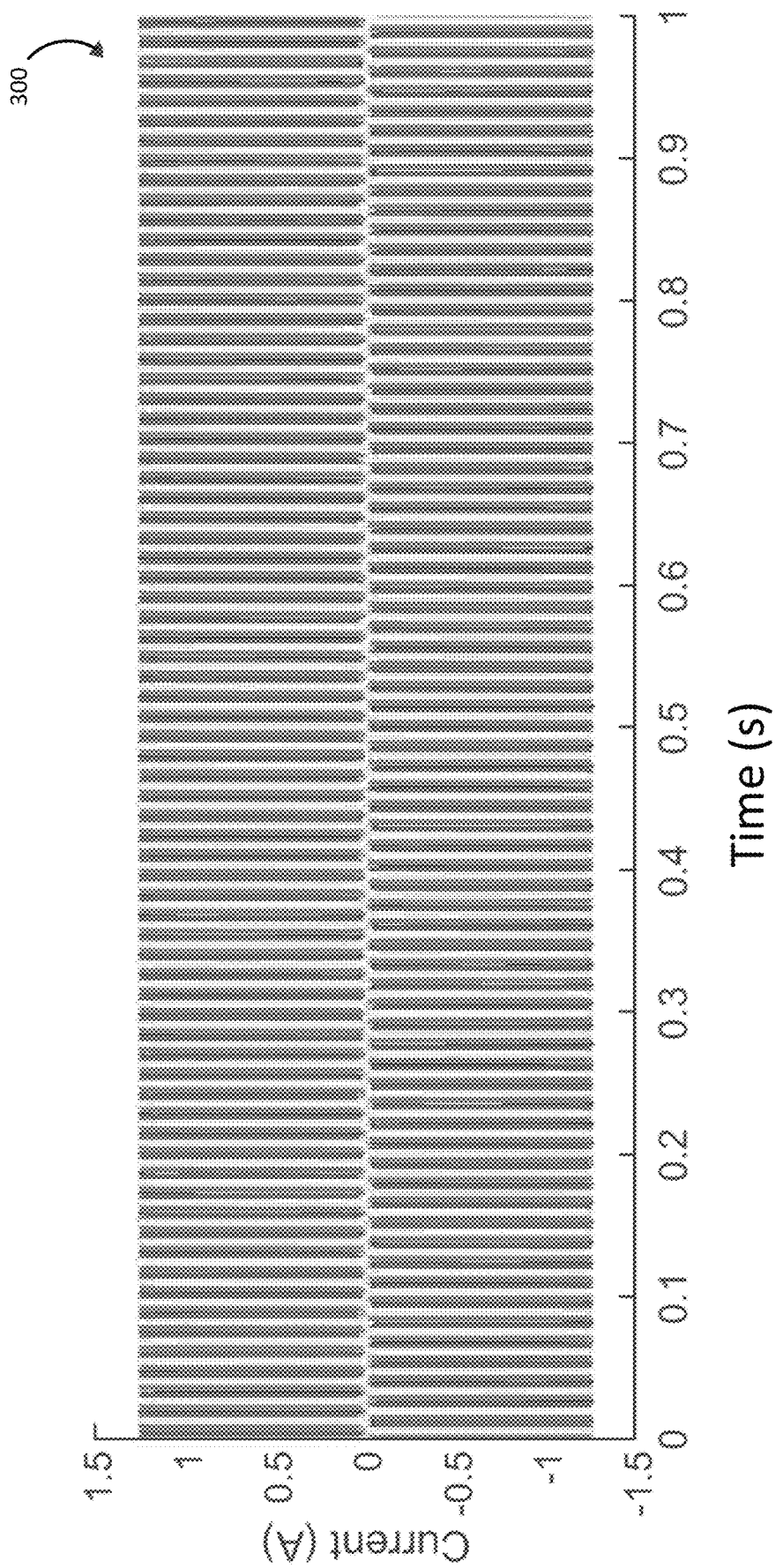
FIG. 3A illustrates example unprocessed waveforms of currents of the motor shown in FIG. 1A in accordance with the principles of the present disclosure.

FIG. 3A illustrates example unprocessed waveforms 300 of currents of the BLDC motor 102 shown in FIG. 1A in accordance with the principles of the present disclosure. The example unprocessed waveforms 300 are the current waveforms of the BLDC motor 102 before being processed, for example, by the anti-aliasing filter circuit 158. The unprocessed current waveforms 300 are trapezoid waveforms that may not be able to be evaluated or otherwise processed, such as by the processing device 160.

Figure 3B:
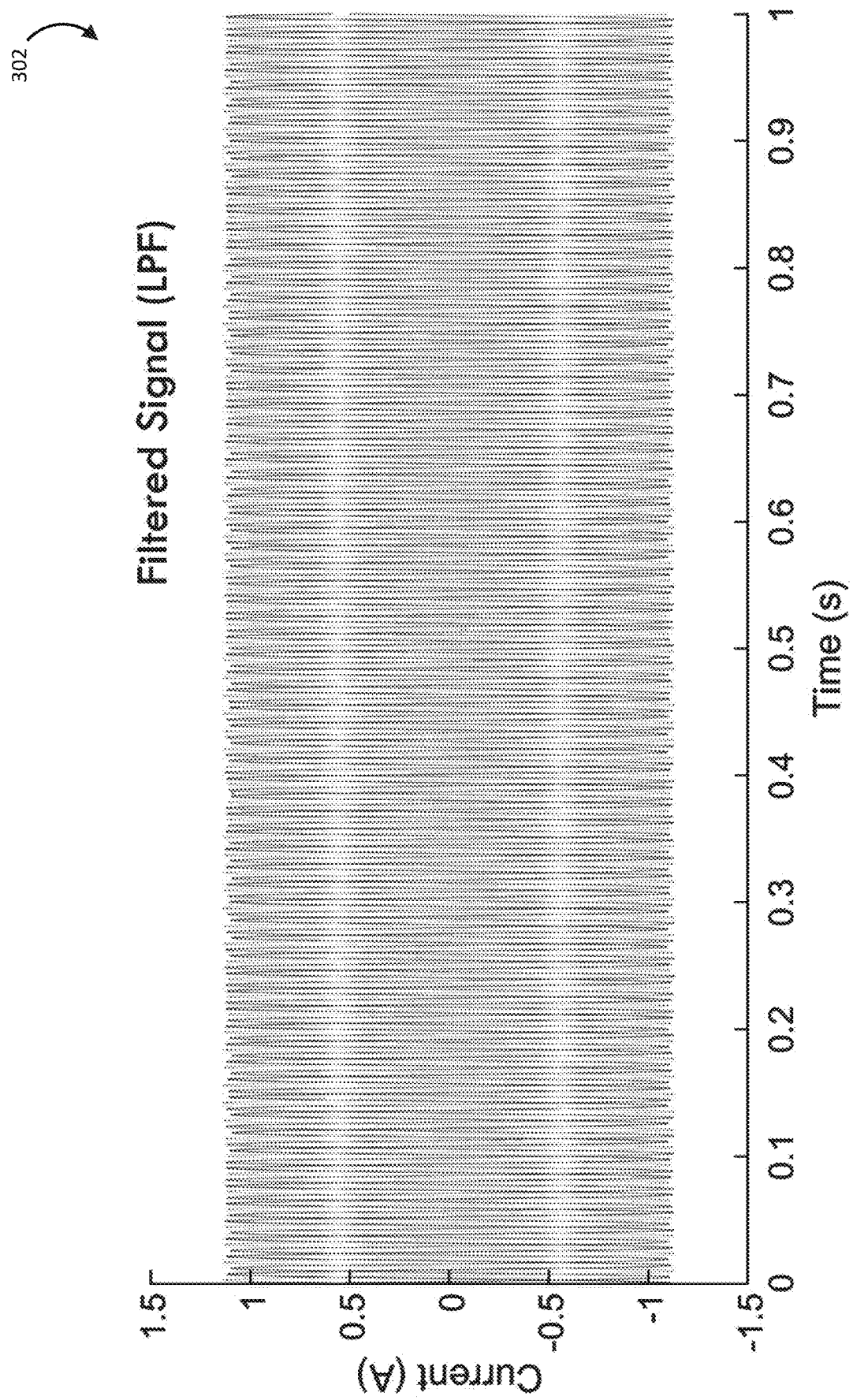
FIG. 3B illustrates example processed waveforms of currents of the motor shown in FIG. 1A in accordance with the principles of the present disclosure.

FIG. 3B illustrates example processed waveforms 302 of currents of the motor shown in FIG. 1A in accordance with the principles of the present disclosure. The processed current waveforms 302 are current waveforms of the BLDC motor 102 that have been processed, such as by the anti-aliasing filter circuit 158. In this example, the anti-aliasing filter circuit 158 applies a low pass filter on the unprocessed current waveforms 300 to produce the processed current waveforms 302. The processed current waveforms 302 may resemble sinusoidal signals such as the current waveforms 202a 202b, 202c. The processed current waveforms 302 may be able to be sampled by the ADC circuit 162 and/or processed by the processing device 160.

In other examples, such as if the motor being evaluated is not a BLDC motor, the anti-aliasing filter circuit 158 will perform different operations to process the current waveforms.

FIG. 4A illustrates example current phasors 400 of the motor 102 shown in FIG. 1A in accordance with the principles of the present disclosure. The example current phasors 400 include current phasors 402a, 402b, and 402c. The current phasors 402a, 402b, 402c graphically represent the magnitude and directional relationship between the currents. In this example, the current phasors 402a, 402b, 402c represent the current waveforms of a three-phase system, such as the BLDC motor 102. The current phasor 402a is the current phasor of the current of one phase, such as the current of the power supplied to armature 104a via conductor 112a as shown in FIG. 1A or via the motor winding fault diagnosis system 120 as shown in FIG. 1B. Similarly, the current phasor 402b is the current phasor of the current supplied to the armature 104b, and the current phasor 402c is the current phasor of the current supplied to the armature 104c.

The current phasors 402a, 402b, 402c may be calculated or otherwise generated by the processing device 160 using the sampled current signals output by the ADC circuit 162. The sampled circuit signals are digital signals representing the processed current waveforms of the BLDC motor 102, such as processed current waveforms 302. In this example, the current phasors 402a, 402b, 402c have the same magnitudes, which is expected in a balanced or otherwise healthy system. If the current magnitudes are not equal, the BLDC motor 102 will not be balanced. Additionally, current phasor 402a may have a phase angle of zero degrees, current phasor 402b may have a phase angle of 120 degrees, and current phasor 402c may have a phase angle of 240 degrees, which is expected in a balanced or healthy system and is referred to as "in phase". If the phase angles of the BLDC motor 102 are not in phase, the current supplied to the BLDC motor 102 will be leading or lagging. A leading or lagging current will include a reactive power component that causes current transmission losses. Thus, the BLDC motor 102 will require more power to operate when leading or lagging currents are present.

Example equations that may be stored in memory 164 and used by the processing device 160 to calculate the current phasors 402a, 402b, 402c include:

$I_a = \max(i_a) * e^{jwt+0°}$ $I_b = \max(i_b) * e^{jwt+\alpha°}$ $I_c = \max(i_c) * e^{jwt+\beta°}$ In this example, $I_a$ represents the phasor 402a, $I_b$ represents current phasor 402b and $I_c$ represents current phasor 402c. $i_a$ is the current supplied to armature 104a, $i_b$ is the current supplied to armature 104b, and $i_c$ is the current suppled to armature 104c. In the equation, e represents Euler's number, a mathematical constant approximately equal to 2.71828. In the equation, j represents the j operator, a complex number equivalent to $\sqrt{-1}$.

FIG. 4B illustrates example sequence components 450 of the BLDC motor 102 shown in FIG. 1A in accordance with the principles of the present disclosure. The sequence components 450 include a zero sequence component 410, a positive sequence component 412, and a negative sequence component 414. The zero sequence component 410 is the zero sequence component of the current phasors 402a, 402b, 402c. The zero sequence component has a value of zero, which is expected for an ideally healthy motor. The positive sequence component 412 is the positive sequence component of the current phasors 402a, 402b, 402c. The negative sequence component 414 is the negative sequence component of the current phasors 402a, 402b, 402c. The negative sequence component has a value of zero, which is expected for an ideally healthy motor.

FIG. 5 is an equation 500 for determining sequence components of the currents of the motor 102 shown in FIG. 1A in accordance with the principles of the present disclosure. The equation may be stored in the memory 164 and used by the processing device 160 to calculate the sequence components of the currents supplied to the BLDC motor 102. $I_a$ represents the current phasor of a current of one phase, such as current phasor 402a. Similarly, $I_b$ may represent current phasor 402b and $I_c$ represents current phasor 402c. $I_0$ represents the zero sequence component, $I_1$ represents the positive sequence component, and $I_2$ represents the negative sequence component.

Figure 6A:
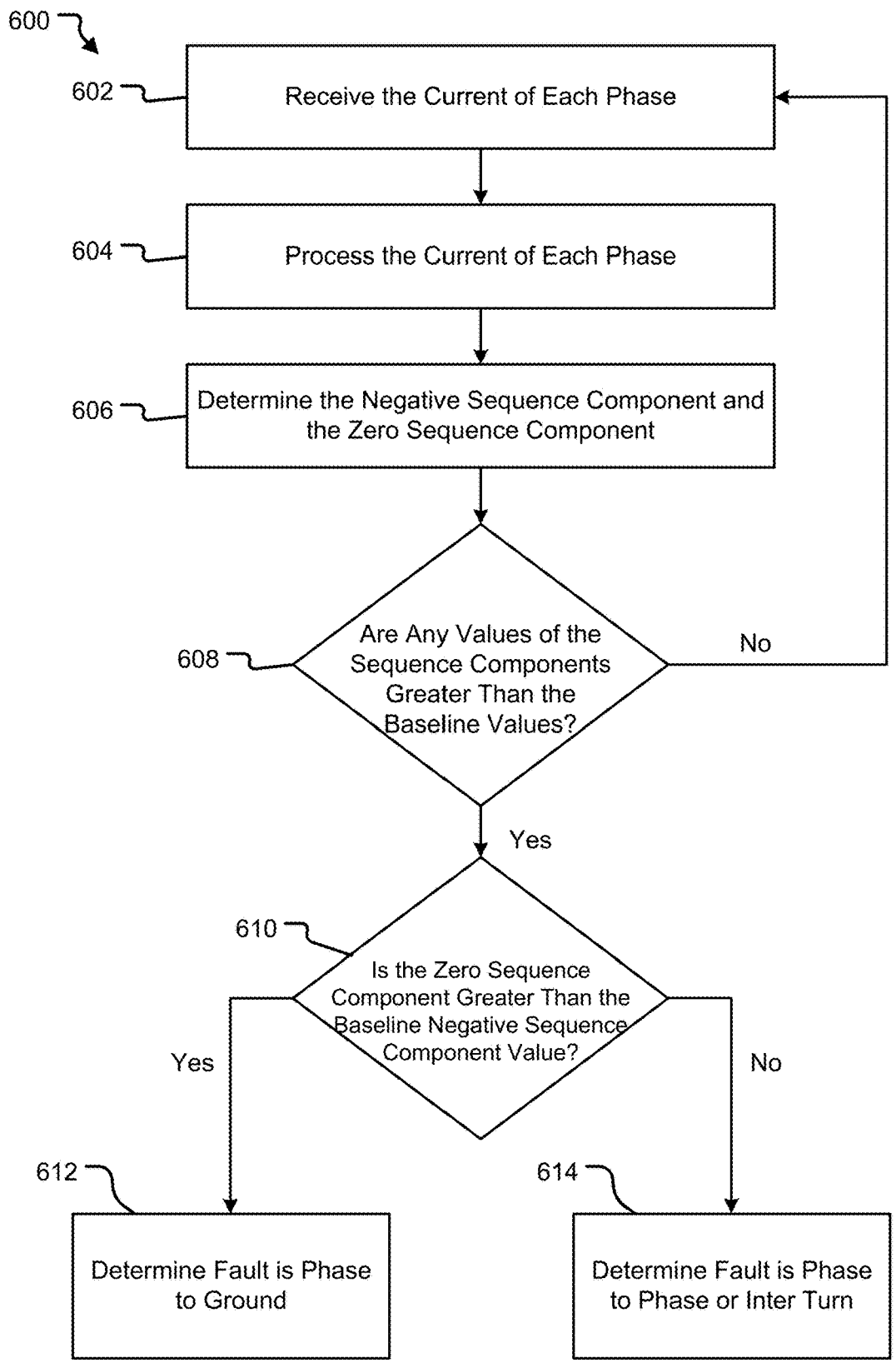
FIG. 6A is a flowchart illustrating an example method for detecting a winding fault in accordance with the principles of the present disclosure.

FIG. 6A is a flowchart illustrating an example method 600 for detecting a winding fault in accordance with the principles of the present disclosure. In certain examples, the components of the motor winding fault diagnosis system 120 perform the operations of method 600. Beginning in operation 602, the current of each phase is received. Receiving the currents may comprise receiving current signals such as digital signals. The current signals can be used by the processing device 160 since they are in digital form. For example, the processing device 160 receives the current signal of each phase. The current of each phase may be in digital form for the processing device 160 to use. The received currents may be sensed by the current sensors 122*a*, 122*b*, 122*c*, received by the three-phase current sensor 152, passed through the buffer circuit 156, processed by the anti-aliasing filter circuit 158, and/or converted from analog form to digital form by the ADC circuit 162 prior to the processing device 160 receiving the currents. The received currents may be the currents of the three-phases of the BLDC motor 102. The received currents may be digital signals sensed over time. The operations of the motor winding fault diagnosis system 120, such as method 600, are advantageous over other methods of detecting a winding fault due to the ability of the motor winding fault diagnosis system 120 to detect a winding fault of a motor that the motor winding fault diagnosis system 120 evaluates using data sensed over a short period of time. In one example, the motor winding fault diagnosis system 120 requires a signal that has a minimum of thirty total cycles. For example, the motor winding fault diagnosis system 120 may require a signal that is captured, or that otherwise includes complete data, for a period of ten times the time period (T) for completing one cycle, such as the complete cycle 204 shown in FIG. 2. Thus, the motor winding fault diagnosis system 120 requires the signal to have data including ten complete cycles for each phase in this example for a total of thirty complete cycles. The motor winding fault diagnosis system 120 can therefore detect a winding fault when a signal is received that includes a minimum of ten complete cycles for each phase.

In certain examples, the currents that are received are only received if the currents are in a steady state. The currents are in a steady state when the currents of each phase are constant over time. For example, the current waveforms of each phase are in a steady state when the amplitude, period and phase angle of the currents do not change over time. In an example, the motor winding fault diagnosis system 120 requires a signal that includes steady state data for each phase for a period of ten times the time period (T) for completing one cycle, such as the complete cycle 204 shown in FIG. 2. Therefore, the motor winding fault diagnosis system 120 can detect a winding fault when a signal is received that includes a minimum of ten complete steady state cycles for each phase. In certain examples, the signals received by the motor winding fault diagnosis system 120 are not consistently steady state. The motor winding fault diagnosis system 120 may wait to evaluate the BLDC motor 102 until ten steady state cycles are received for each phase. The steady state cycles may be required to occur consecutively, substantially consecutively, or within some other period of time to be grouped as the minimum ten steady state cycles to be used by the processing system 160.

Once the currents are received, the current of each phase is processed in operation 604. For example, the processing device 160 processes the currents. For example, the processing device 160 generates a current phasor for each current received. The processing device 160 may execute instructions stored by the memory 164 to perform operations to process the currents. In one example, the processing device 160 uses the equations described above to determine the current phasors.

In operation 606, the negative sequence component and the zero sequence component are determined. For example, the processing device 160 determines the negative sequence component and the zero sequence component of the power supplied to the BLDC motor 102 using the current of each phase received in operation 602.

In operation 608, it is determined whether any of the sequence components are greater than a baseline value. For example, the baseline value may be stored in the memory 164. The baseline value is set to a value that indicates the maximum acceptable sequence component value. The processing device 160 may compare the sequence components to the baseline value and determines whether one or all of the sequence components are greater than the corresponding baseline sequence component. In an example, the processing device 160 determines only whether the negative sequence component and the zero sequence component are greater than the corresponding baseline sequence component values. In an example, the baseline value may be obtained by evaluating the operation of the motor when the motor, such as BLDC motor 102, is operating normally, such as when the motor is installed. Operating data will be collected, such as by the processing system 160, and stored in the memory 164 for example. The operating data includes one or more values that the motor has when operating correctly. A deviation from these values indicates an issue with the motor such as a winding fault. One or more of the values can be used by the processing device 160 as the baseline value or used to calculate the baseline value. For example, the processing device 160 can use the operating data to determine baseline sequence components, such as by using methods and equations described above. The memory 164 may then store the baseline sequence components, and the processing system 160 may access the baseline sequence components for use in operation 608.

If it is determined that neither of the sequence components are greater than the baseline value, method 600 can proceed back to operation 602. Once flow proceeds back to operation 602, the currents of each phase for the current time period are received. The currents may differ from the currents originally received due to changes in the operation of the BLDC motor 102 over time. Flow may proceed back to operation 602 instantly, periodically, or optionally not proceed to operation 602 depending on the frequency the processing device 160 evaluates the BLDC motor 102 to detect the presence of a winding fault.

If it is determined that one or more of the sequence components is greater than the baseline value, this indicates that the motor being evaluated has a winding fault. The method 600 may optionally conclude at operation 608 if the motor winding fault diagnosis system 120 only needs to detect the presence of a winding fault. Typically, though, method 600 proceeds to operation 610 after the winding fault is detected.

In operation 610, it is determined whether the zero sequence component is greater than a baseline zero sequence component. The baseline zero sequence component is a value equivalent to the zero sequence component of a healthy motor. In one example, the memory 164 stores the baseline zero sequence component, and the processing device 160 compares the zero sequence component and the baseline zero sequence component. In one example, the processing device 160 has already determined that the zero sequence component is greater than the baseline zero sequence component in operation 608, but the processing system 160 was just determining whether any sequence component was greater than the corresponding baseline component in operation 608. Thus, in operation 610, the processing system 160 only needs to determine whether the zero sequence component was the one or more sequence components that was determined to be greater than the corresponding baseline sequence component in operation 608.

If it is determined that the zero sequence component is greater than the baseline zero sequence component value, flow proceeds to operation 612. In operation 612, it is determined, by the processing device 160 for example, that the winding fault is a phase to ground fault. A phase to ground fault includes the flow of current from one or more phases to ground. If it is determined that the zero sequence component is not greater than the baseline zero sequence component value, flow proceeds to operation 614. In operation 614, it is determined, by the processing device 160 for example, that the winding fault is one of a phase to phase fault or an inter turn fault. A phase to phase fault includes the flow of current from one or more phases to another phase. The inter turn fault includes the flow of current between the windings of the phase such as by insulation failure. Both the inter turn and phase to phase faults lead to a change in the negative sequence components with respect to the baseline negative sequence component, which is why the processing system 160 determines that the winding fault is phase to phase fault or an inter turn fault if the negative sequence component is not greater than the baseline zero sequence component.

The motor winding fault diagnosis system 120 may have a component capable of communicating the winding fault determination to a system, display the determination, and/or otherwise send a notification regarding the determination. The notification may allow a user to perform maintenance on the BLDC motor 102 to prevent the motor from failing.

Figure 6B:
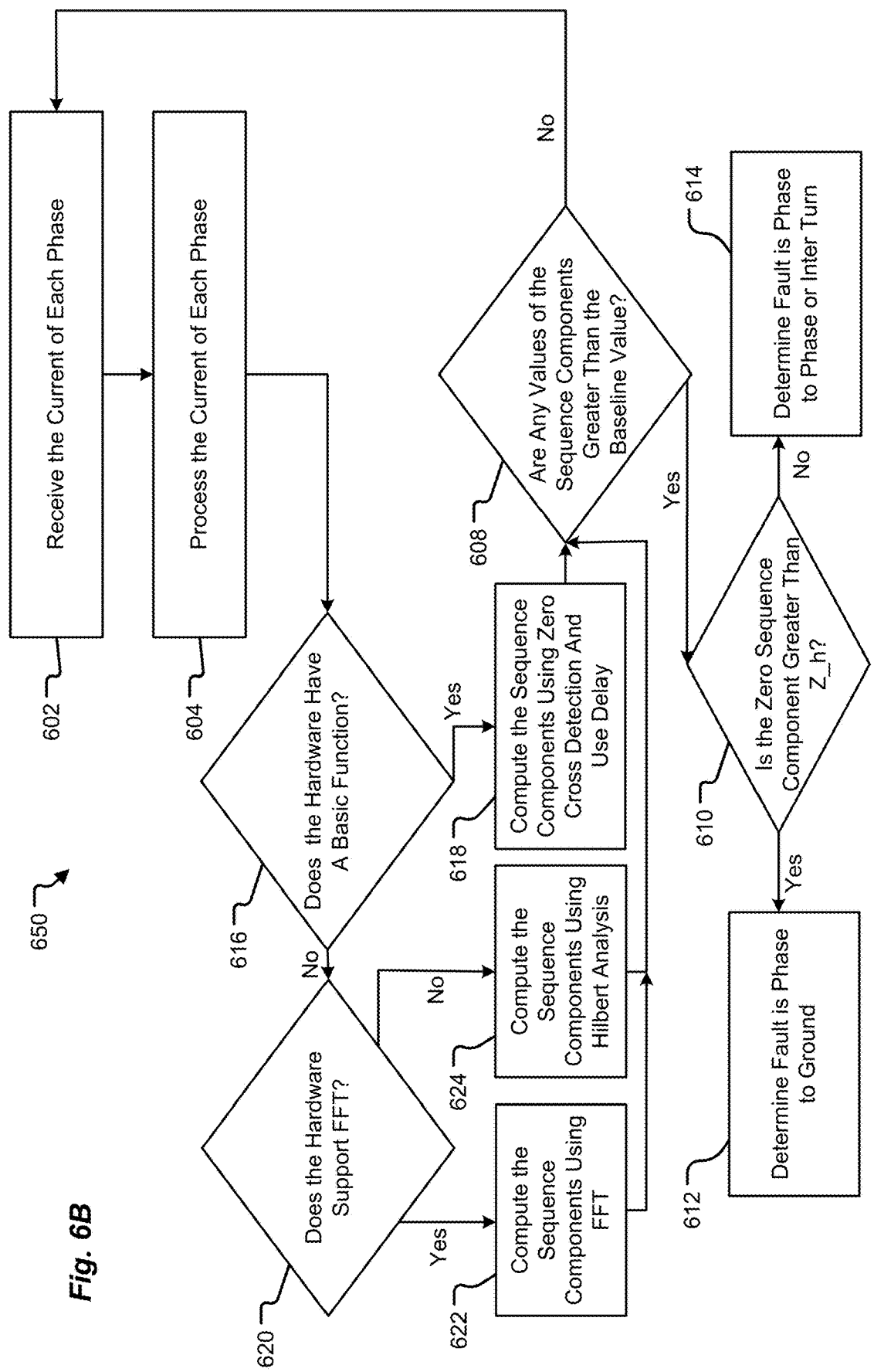
FIG. 6B is a flowchart illustrating an example method for detecting a winding fault and determining a method for calculating sequence components in accordance with the principles of the present disclosure.

FIG. 6B is a flowchart illustrating another example method 650 for detecting a winding fault and determining a method for calculating sequence components in accordance with the principles of the present disclosure. Method 650 includes multiple operations that are included in method 600. These operations will not be discussed in detail with respect to the description of method 650. Method 650 is an additional method for detecting a winding fault similar to method 600, but the method 650 additionally includes operations for determining how the sequence components should be calculated.

Method 650 begins in operation 602, and the current of each phase is received. In operation 604, the current of each phase is processed. Flow proceeds to operation 616, and it is determined whether the hardware has a basic function. For example, the processing device 160 determines whether the hardware has basic functionality. In one example, the hardware is one or more of the components of the motor winding fault diagnosis system 120.

If the hardware is determined to have a basic function, method 650 proceeds to operation 618. In operation 618, the sequence components are determined, such as by the processing device 160, using zero cross detection and use delay. In another example, the processing device 160 may determine the sequence components using Hilbert analysis. Method 650 proceeds to operation 608 after the sequence components are determined.

If the hardware is determined not to have a basic function, method 650 proceeds to operation 620. In operation 620, it is determined, such as by the processing device 160, whether the hardware supports FFT analysis. In one example, the hardware of the motor winding fault diagnosis system can support FFT analysis if the received currents include at least ten seconds of steady state data.

If it is determined that the hardware supports FFT analysis, method 650 proceeds to operation 622. In operation 622, the sequence components, by the processing device 160 for example, are determined using FFT analysis. Method 650 proceeds to operation 608 after the sequence components are determined.

If it is determined that the hardware does not support FFT analysis in operation 620, method 650 proceeds to operation 624. The sequence components are determined, such as by the processing device 160, using Hilbert analysis. Method 650 proceeds to operation 608 after the sequence components are determined.

Operations 608, 610, 612, and 614 are described above with respect to method 600.

Figure 7:
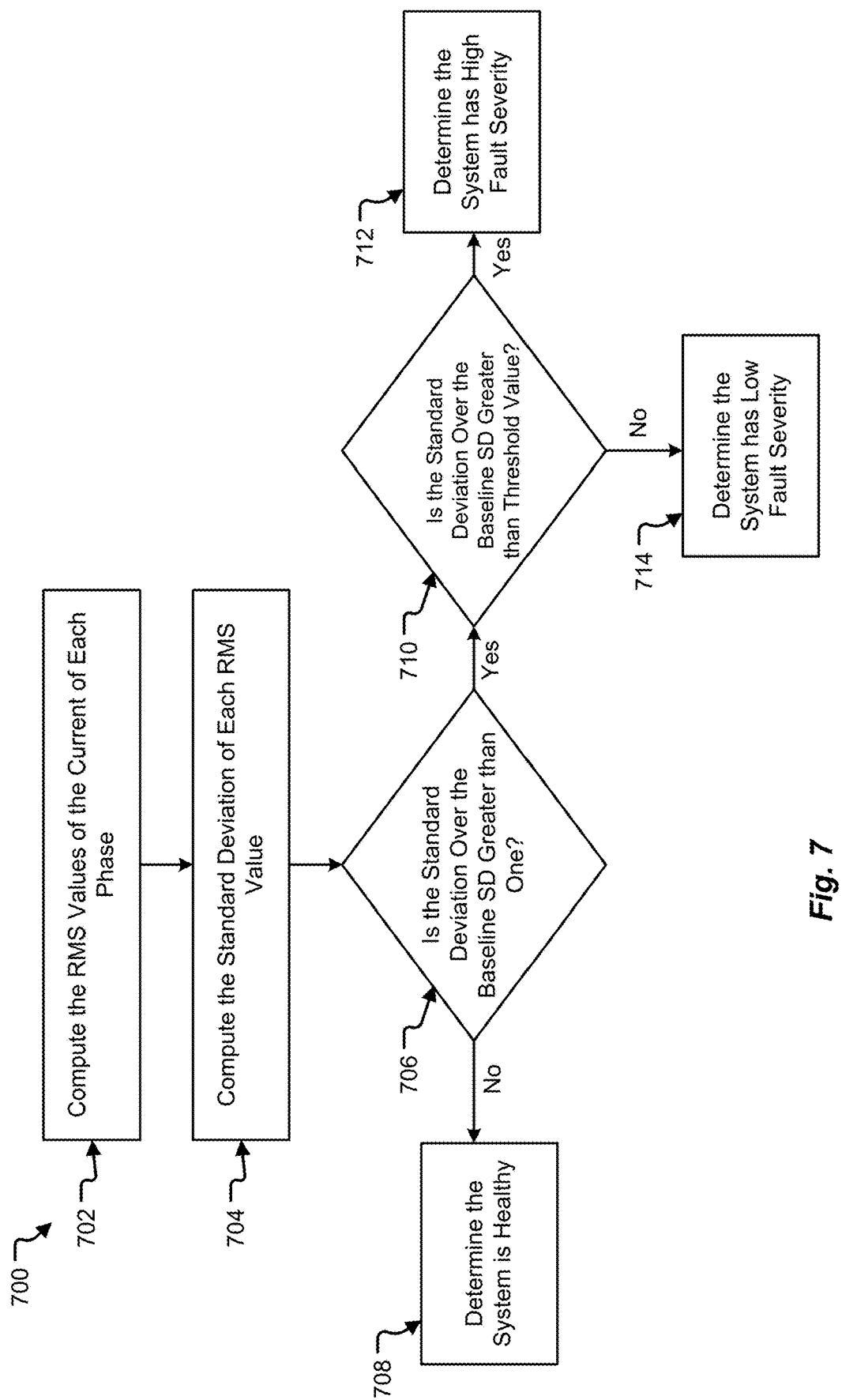
FIG. 7 is a flowchart illustrating an example method for detecting the severity of a winding fault in accordance with the principles of the present disclosure.

FIG. 7 is a flowchart illustrating an example method 700 for detecting the severity of a winding fault in accordance with the principles of the present disclosure. For example, when the motor winding fault diagnosis system 120 determines that the BLDC motor 102 has a winding fault, motor winding fault diagnosis system 120 will perform method 700 to determine the severity of the winding fault.

Method 700 begins at operation 702, and the RMS value of the current of each phase is calculated. For example, the processing device 160 computes the RMS value of the current of each phase.

In operation 704, the standard deviation of each RMS value calculated in operation 702 is determined. For example, the processing device 160 computes the standard deviation of the RMS value of the current of each phase.

In operation 706, it is determined, such as by the processing device 160, whether the standard deviation divided by a baseline standard deviation is greater than one. The baseline standard deviation is a value equivalent to the standard deviation of a healthy motor. The baseline standard deviation value may be stored in memory 164. In one example, the processing device 160 determines whether the standard deviation divided by the baseline standard deviation is greater than one. The baseline standard deviation may be determined in the same or similar way the baseline values are determined as described above. The motor may be operated when the motor is functioning normally, such as after installation. Data regarding the operation of the motor can be collected by the processing system 160, may be stored by the memory 164, and may be used by the processing system to determine the baseline standard deviation.

If the standard deviation divided by the baseline standard deviation is determined to not be greater than one, method 700 proceeds to operation 708. In operation 708, it is determined, such as by the processing device 160, that the BLDC motor 102 is healthy. Method 700 ends at operation 708.

If the standard deviation divided by the baseline standard deviation is determined to be greater than one, method 700 proceeds to operation 710. In operation 710, it is determined, such as by the processing device 160, whether the standard deviation divided by the baseline standard deviation is greater than a threshold value. The threshold value is a value that indicates whether the severity of the winding fault is low or high. A high severity winding fault indicates imminent failure and/or danger, and a low severity fault indicates an issue that may not require immediate intervention and/or attention. The threshold value may be determined in the same or similar way the baseline values are determined as described above. The motor may be operated when the motor is functioning normally, such as after installation. Data can be collected, such as by the processing system 160, regarding the operation of the motor and may be stored by the memory 164. The collected data may include values that are used as the threshold value or to calculate the threshold value. For example, the data is used to determine a threshold value of a real number N divided by the baseline standard deviation. The real number N may be calculated using the data. In an example, the real number N divided by the baseline standard deviation is determined to be 1.5.

If it is determined that the standard deviation divided by the baseline standard deviation is not greater than the threshold value, method 700 proceeds to operation 714. In operation 714, it is determined that the winding fault has a low severity, such as by the processing device 160. Method 700 ends at operation 714.

If it is determined that the standard deviation divided by the baseline standard deviation is greater than the threshold value, method 700 proceeds to operation 712. In operation 712, it is determined that the winding fault has a high severity, such as by the processing device 160. Method 700 ends at operation 712.

The motor winding fault diagnosis system 120 may notify or otherwise communicate the fault severity determination for a user to perform maintenance on the BLDC motor 102. In one example, the motor winding fault diagnosis system 120 may cause the BLDC motor 102 to cease operation if it is determined that the fault severity is high.

Figure 8:
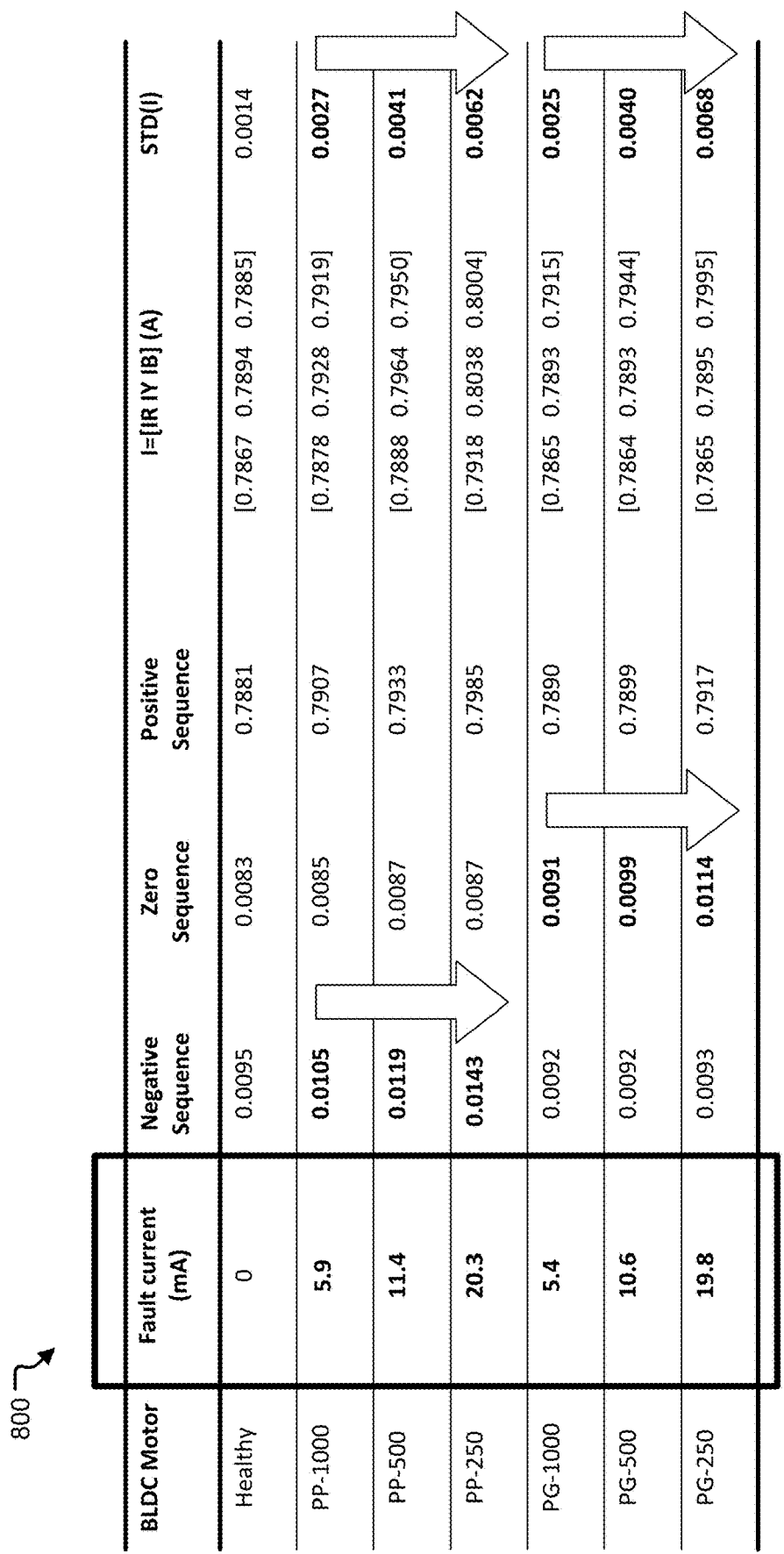
FIG. 8 illustrates example measurements used for detecting a winding fault and/or the severity of the winding fault of the motor shown in FIG. 1A in accordance with the principles of the present disclosure.

FIG. 8 illustrates example measurements 800 used for detecting a winding fault and/or the severity of the winding fault of the BLDC motor 102 shown in FIG. 1A in accordance with the principles of the present disclosure. Example measurements of a healthy motor are depicted, which may be used as various baseline and/or threshold values such as those described above. Example measurements of motors with varying severities of winding faults are also depicted. As shown by the example measurements 800, an increase in negative sequence component $I_2$ is an indicator of inter-turn and phase to phase fault. Additionally, an increase in the value of zero sequence component $I_0$ is an indicator of phase to ground fault. As the fault severity increases under both these faults, the RMS current values and the standard deviation between the RMS current values also increases.

The motor winding fault diagnosis system 120 may additionally calculate a Delta (D) to detect winding faults and/or the severity of winding faults. The motor winding fault diagnosis system 120 may calculate D using the following equation:

$$D=|0.8165i_a-1.1154i_b+0.2989i_c|$$

The motor winding fault diagnosis system 120 may also calculate the direct current ($i_d$) and the quadrature current ($i_q$) using the following equations:

$$i_d = \sqrt{\frac{2}{3}}i_a - \frac{1}{\sqrt{6}}i_b - \frac{1}{\sqrt{6}}i_c$$

$$i_q = \frac{1}{\sqrt{2}}i_b - \frac{1}{\sqrt{2}}i_c$$

The motor winding fault diagnosis system 120 may then calculate D using the following equation:

$$D=rms(i_d)-rms(i_q)$$

Under ideal conditions, $i_d$, $i_q$, and D may have the following values:

$$i_d = \frac{\sqrt{6}}{2}I\sin(wt) = A1*\sin(wt)$$

$$i_q = \frac{\sqrt{6}}{2}I\sin\left(wt-\frac{\pi}{2}\right) = A2*\sin\left(wt-\frac{\pi}{2}\right)$$

$$\text{Delta }(D) = (A1-A2) = 0$$

Therefore, D may be zero under ideal conditions, indicating that there is no winding fault present. Referring back to FIG. 6A, the motor winding fault diagnosis system 120 may also determine D in operation 606. Thus, in operation 608 (e.g., in FIG. 6A and/or in FIG. 6B), the motor winding fault diagnosis system 120 may compare the determined D to a baseline D value, such as a range of D values that indicate no winding fault is presence. If the determined D is outside of the baseline D value, the motor winding fault diagnosis system 120 may determine the severity of the winding fault based on the distance of D from the baseline D value.

In some examples, the baseline values compared to the sequence components and/or D may be ranges of values. The motor winding fault diagnosis system 120 may compare the components and/or D to the baseline values to determine if the components and/or D are within the range of values. Therefore, there may additionally be a minimum value that the sequence components and/or D must meet for the motor winding fault diagnosis system 120 to determine there is not a winding fault. For example, in operation 608 shown in FIG. 6A and FIG. 6B, the motor winding fault diagnosis system 120 may determine if any values of the sequence components are greater or lower than the baseline value range. If any values of the sequence components are greater or lower than the baseline value range, the motor winding fault diagnosis system 120 may determine a winding fault is present and proceed to operation 610. Similarly, in operation 706 illustrated by FIG. 7, the motor winding fault diagnosis system 120 may compare the standard deviation to a range of baseline standard deviation values. If the standard deviation is outside of the range of the baseline standard deviation values, the motor winding fault diagnosis system 120 may determine a winding fault is present and proceed to operation 710.

In some examples, the motor winding fault diagnosis system 120 may evaluate a motor not be operating in a steady state. The motor winding fault diagnosis system 120 may determine the presence of winding faults in a motor not operating in a steady state by determining a range of values that indicate whether the motor has a winding fault (e.g., a baseline value range). The distance the sequence components and/or D are from the range of values may indicate the severity of the winding fault. Therefore, the motor winding fault diagnosis system 120 can detect winding faults even as the motor operates intermittently or is otherwise not in a steady state.

The examples described herein may be implemented using hardware, software, or a combination thereof and may be implemented in one or more computer systems or other processing devices. However, some manipulations performed by these examples may be referred to in terms which are commonly associated with mental operations performed by a human operator. No such capability of a human operator is necessary, in any of the operations described herein. Rather, the operations may be completely implemented with machine operations. Useful machines for performing the operation of the examples presented herein include general purpose computers or similar devices.

From a hardware standpoint, a CPU typically includes one or more components, such as one or more microprocessors, for performing the arithmetic and/or logical operations required for program execution, and storage media, such as one or more memory cards (e.g., flash memory) for program and data storage, and a random access memory, for temporary data and program instruction storage. From a software standpoint, a CPU typically includes software resident on a storage media (e.g., a memory card), which, when executed, directs the CPU in performing transmission and reception functions. The CPU software may run on an operating system stored on the storage media, such as, for example, UNIX or Windows, iOS, Linux, and the like, and can adhere to various protocols such as the Ethernet, ATM, TCP/IP protocols and/or other connection or connectionless protocols. As is well known in the art, CPUs can run different operating systems, and can contain different types of software, each type devoted to a different function, such as handling and managing data/information from a particular source or transforming data/information from one format into another format. It should thus be clear that the examples described herein are not to be construed as being limited for use with any particular type of server computer, and that any other suitable type of device for facilitating the exchange and storage of information may be employed.

A CPU may be a single CPU, or may include plural separate CPUs, wherein each is dedicated to a separate application, such as, for example, a data application, a voice application, and/or a video application. Software examples of the examples presented herein may be provided as a computer program product, or software, that may include an article of manufacture on a machine accessible or non-transitory computer-readable medium (i.e., also referred to as "machine readable medium") having instructions. The instructions on the machine accessible or machine readable medium may be used to program a computer system or other electronic device. The machine-readable medium may include, but is not limited to, optical disks, CD-ROMs, and magneto-optical disks or other type of media/machine-readable medium suitable for storing or transmitting electronic instructions. The techniques described herein are not limited to any particular software configuration. They may find applicability in any computing or processing environment. The terms "machine accessible medium", "machine readable medium" and "computer-readable medium" used herein shall include any non-transitory medium that is capable of storing, encoding, or transmitting a sequence of instructions for execution by the machine (e.g., a CPU or other type of processing device) and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing device causes the processor to perform an action to produce a result.

Various modifications and alterations of this disclosure will become apparent to those skilled in the art without departing from the scope and spirit of this disclosure, and it should be understood that the inventive scope of this disclosure is not to be unduly limited to the illustrative examples set forth herein.

What is claimed is:

1. A method for detecting a winding fault in a motor, comprising:
   receiving a current signal at each armature of the motor, wherein each armature is operable to receive a phase of power received by the motor;
   processing each current signal to determine a current phasor of each current signal;
   determining a negative sequence component using the current phasors;
   determining a zero sequence component using the current phasors;
   comparing the negative sequence component to a baseline negative sequence component and the zero sequence component to a baseline zero sequence component; and
   in response to determining that one or both of the negative sequence component is greater than the baseline negative sequence component and the zero sequence component is greater than the baseline zero sequence component, determining that the motor has the winding fault.

2. The method of claim 1, further comprising, in response to determining that the motor has the winding fault:
   in response to determining that the zero sequence component is greater than the baseline zero sequence component, determining that the winding fault is a phase to ground fault; and
   in response to determining that the zero sequence component is not greater than the baseline zero sequence component, determining that the winding fault is either a phase to phase fault or an inter turn fault.

3. The method of claim 1, further comprising, determining that the motor does not have the winding fault in response to determining that both the negative sequence component is not greater than the baseline negative sequence component and the zero sequence component is not greater than the baseline zero sequence component.

4. The method of claim 1, wherein determining the negative sequence component using the current phasors and determining the zero sequence component using the current phasors comprises using zero cross detection and use delay.

5. The method of claim 1, wherein determining the negative sequence component using the current phasors and determining the zero sequence component using the current phasors comprises using FFT analysis.

6. The method of claim 1, wherein determining the negative sequence component using the current phasors and determining the zero sequence component using the current phasors comprises using Hilbert analysis.

7. The method of claim 1, wherein the motor is a three-phase motor.

8. The method of claim 1, wherein the current signals include at least ten complete cycles of each phase.

9. The method of claim 1, wherein processing each current signal to determine a current phasor of each current signal comprises:
   determining a time period the current signals were received;
   determining a supply frequency;
   determining an angular frequency;
   determining a phase difference for each current signal; and
   determining the current phasor of each current signal based at least in part on the time period, the supply frequency, the angular frequency, and the phase difference of each current signal.

10. The method of claim 9, wherein determining the current phasor of each current signal based at least in part on the supply frequency, the angular frequency, and the phase difference of each current signal comprises, for each respective current signal, determining the product of a maximum current value of the respective current signal and Euler's number raised to the power of the product of a j operator, the time period, and the angular frequency added to the phase difference of the respective current signal.

11. A system for detecting a winding fault in a motor, comprising:
 a memory; and
 a processing device operable to execute instructions stored in the memory, wherein the executed instructions are operable to cause the processing device to:
  receive a current signal at each armature of the motor, wherein each armature is operable to receive a phase of power received by the motor;
  process each current signal to determine a current phasor of each current signal;
  determine a negative sequence component using the current phasors;
  determine a zero sequence component using the current phasors;
  compare the negative sequence component to a baseline negative sequence component and the zero sequence component to a baseline zero sequence component; and
  in response to determining that one or both of the negative sequence component is greater than the baseline negative sequence component and the zero sequence component is greater than the baseline zero sequence component, determining that the motor has the winding fault.

12. The system of claim 11, wherein the processing device is operable to execute further instructions that are operable to cause the processing device to:
 in response to determining that the motor has the winding fault:
  if the zero sequence component is greater than the baseline zero sequence component, determine that the winding fault is a phase to ground fault; and
  if the zero sequence component is not greater than the baseline zero sequence component, determine that the winding fault is either a phase to phase fault or an inter turn fault.

13. The system of claim 11, wherein the processing device is operable to execute further instructions that are operable to cause the processing device to determine that the motor does not have the winding fault in response to determining that both the negative sequence component is not greater than the baseline negative sequence component and the zero sequence component is not greater than the baseline zero sequence component.

14. The system of claim 11, wherein determining the negative sequence component using the current phasors and determining the zero sequence component using the current phasors comprises causing the processing device to:
 determine whether the processing device has only basic functionality; and
 determine the sequence components using zero cross detection and use delay in response to determining that the processing device has only basic functionality.

15. The system of claim 14, wherein the processing device is operable to execute further instructions that are operable to cause the processing device to:
 in response to determining that the motor has the winding fault:
  if the zero sequence component is greater than the baseline zero sequence component, determine that the winding fault is a phase to ground fault; and
  if the zero sequence component is not greater than the baseline zero sequence component, determine that the winding fault is either a phase to phase fault or an inter turn fault.

16. The system of claim 14, wherein determining the negative sequence component using the current phasors and determining the zero sequence component using the current phasors further comprises causing the processing device to determine whether the processing device supports FFT analysis in response to determining that the processing device does not only have basic functionality.

17. The system of claim 16, wherein determining the negative sequence component using the current phasors and determining the zero sequence component using the current phasors further comprises causing the processing device to determine the sequence components using FFT analysis in response to determining that the processing device supports FFT analysis.

18. The system of claim 17, wherein the processing device is operable to execute further instructions that are operable to cause the processing device to:
 in response to determining that the motor has the winding fault:
  if the zero sequence component is greater than the baseline zero sequence component, determine that the winding fault is a phase to ground fault; and
  if the zero sequence component is not greater than the baseline zero sequence component, determine that the winding fault is either a phase to phase fault or an inter turn fault.

19. A method for determining a severity of a winding fault in a motor, comprising:
 determining a real mean squared (RMS) value using a current signal of each armature of the motor, wherein each armature is operable to receive a phase of power received by the motor;
 determining a standard deviation of the RMS value;
 determining whether the standard deviation divided by a baseline standard deviation is greater than one;
 in response to determining the standard deviation divided by the baseline standard deviation is greater than one:
  determining whether the standard deviation divided by the baseline standard deviation is greater than a threshold value;
  in response to determining that the standard deviation divided by the baseline standard deviation is greater than the threshold value, determining that the severity is low; and
  in response to determining that the standard deviation divided by the baseline standard deviation is greater than the threshold value, determining that the severity is high.

20. The method of claim 19, further comprising, determining the motor does not have the winding fault in response to determining the standard deviation divided by the baseline standard deviation is not greater than one.

* * * * *